US009224841B2

(12) United States Patent
Harame et al.

(10) Patent No.: US 9,224,841 B2
(45) Date of Patent: Dec. 29, 2015

(54) SEMICONDUCTOR FINS ON A TRENCH ISOLATION REGION IN A BULK SEMICONDUCTOR SUBSTRATE AND A METHOD OF FORMING THE SEMICONDUCTOR FINS

(71) Applicant: International Business Machines Corporation, Armonk, NY (US)

(72) Inventors: David L. Harame, Essex Junction, VT (US); Qizhi Liu, Lexington, MA (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 11 days.

(21) Appl. No.: 14/162,403

(22) Filed: Jan. 23, 2014

(65) Prior Publication Data
US 2015/0206746 A1 Jul. 23, 2015

(51) Int. Cl.
*H01L 31/111* (2006.01)
*H01L 29/66* (2006.01)
*H01L 21/762* (2006.01)
*H01L 27/088* (2006.01)
*H01L 21/8234* (2006.01)

(52) U.S. Cl.
CPC .... *H01L 29/66795* (2013.01); *H01L 21/76224* (2013.01); *H01L 21/823431* (2013.01); *H01L 21/823481* (2013.01); *H01L 27/0886* (2013.01)

(58) Field of Classification Search
CPC .................. H01L 21/02598; H01L 29/66795
USPC ....................................................... 257/118
See application file for complete search history.

(56) References Cited

U.S. PATENT DOCUMENTS

| 5,729,043 | A | * | 3/1998 | Shepard ......................... 257/519 |
| 7,517,764 | B2 | | 4/2009 | Booth, Jr. et al. |
| 7,696,568 | B2 | | 4/2010 | Hwang et al. |
| 7,989,296 | B2 | | 8/2011 | Lee et al. |
| 8,101,486 | B2 | | 1/2012 | Maszara et al. |
| 8,293,616 | B2 | | 10/2012 | Chang et al. |
| 8,455,307 | B2 | | 6/2013 | Cho |
| 2002/0171118 | A1 | * | 11/2002 | Mandelman et al. .......... 257/510 |
| 2005/0224875 | A1 | * | 10/2005 | Anderson et al. .............. 257/347 |
| 2008/0026520 | A1 | * | 1/2008 | Yan et al. ........................ 438/198 |
| 2010/0163971 | A1 | | 7/2010 | Hung et al. |
| 2011/0298050 | A1 | | 12/2011 | Luo et al. |

(Continued)

OTHER PUBLICATIONS

Zhou, et al., "Fabrication of Bulk-Si FinFET using CMOS Compatible Process," Elsevier, Microelectronic Engineering, 94, 2012, pp. 26-28.

(Continued)

*Primary Examiner* — Ajay K Arora
(74) *Attorney, Agent, or Firm* — Gibb & Riley, LLC; Michael J. LeStrange, Esq.

(57) ABSTRACT

Disclosed are semiconductor structures with monocrystalline semiconductor fins, which are above a trench isolation region in a semiconductor substrate and which can be incorporated into semiconductor device(s). Also disclosed are methods of forming such structures by forming sidewall spacers on opposing sides of mandrels on a dielectric cap layer. Between adjacent mandrels, an opening is formed that extends vertically through the dielectric cap layer and through multiple monocrystalline semiconductor layers into a semiconductor substrate. A portion of the opening within the substrate is expanded to form a trench. This trench undercuts the semiconductor layers and extends laterally below adjacent sidewall spacers on either side of the opening. The trench is then filled with an isolation layer, thereby forming a trench isolation region, and a sidewall image transfer process is performed using the sidewall spacers to form a pair of monocrystalline semiconductor fins above the trench isolation region.

20 Claims, 14 Drawing Sheets

(56) References Cited

U.S. PATENT DOCUMENTS

| | | |
|---|---|---|
| 2011/0300700 A1 | 12/2011 | Kim |
| 2013/0020623 A1* | 1/2013 | Tsui et al. ............... 257/300 |
| 2013/0056802 A1 | 3/2013 | Cheng et al. |
| 2013/0256759 A1 | 10/2013 | Vellianitis et al. |
| 2014/0015056 A1* | 1/2014 | Fu et al. ............... 257/368 |

OTHER PUBLICATIONS

Xu, et al., "High-Performance BOI FinFETs Based on Bulk-Silicon Substrate," IEEE Transactions on Electron Devices, vol. 55, No. 11, Nov. 2008, pp. 3246-3250.

Tai, et al., Local Oxidation Fin-Field-Effect-Transistor Structure for Nanodevice Applications, Japanese Journal of Applied Physics, 49, 2010, pp. 044301-1-044301-5.

Park, et al, "Fully Integrated Advanced Bulk FinFETs Architecture Featuring Partially-Insulating Technique for DRAM Cell Application of 40nm Generation and Beyond," IEEE International Electron Devices Meeting, 2006, pp. 1-4.

Monfray, et al., "Localized SOI Technology: An Innovative Low Cost Self-Aligned Process for Ultra Thin Si-Film on Thin BOX Integration for Low Power Applications," IEEE International Electron Devices Meeting, 2007, pp. 693-696.

* cited by examiner

US 9,224,841 B2

SEMICONDUCTOR FINS ON A TRENCH ISOLATION REGION IN A BULK SEMICONDUCTOR SUBSTRATE AND A METHOD OF FORMING THE SEMICONDUCTOR FINS

BACKGROUND

The present disclosure relates to non-planar semiconductor devices and, more particularly, to a semiconductor structure, which comprises monocrystalline semiconductor fins that are above a trench isolation region in a bulk semiconductor substrate and that can be incorporated into semiconductor device(s), and a method of forming the semiconductor structure.

Integrated circuit design decisions are often driven by device scalability, manufacturing efficiency and costs. For example, size scaling of a single-gate planar field effect transistor resulted in a smaller channel length and, unfortunately, the smaller channel length resulted in a corresponding increase in short channel effects and a decrease in drive current. In response, different types of multi-gate non-planar field effect transistors (MUGFETs), such as dual-gate non-planar FETs (also referred to herein as fin-type FETs (FIN-FETs)) and tri-gate non-planar FETs, comprising one or more semiconductor fins were developed in order to provide reduced-size field effect transistors, while simultaneously avoiding corresponding increases in short channel effects and decreases in drive current. Semiconductor fins for such MUGFETs are typically formed using semiconductor-on-insulator (SOI) wafers so that the insulator layer will provide electrical isolation between the semiconductor fins and the semiconductor substrate below. Unfortunately, the costs associated using SOI wafers can be relatively high, thereby limiting access to such advanced technologies. Therefore, there is a need in the art for a method of forming semiconductor fins for non-planar semiconductor device(s), such as MUGFETs, on a bulk semiconductor substrate to lower costs and, thereby lower the access threshold for such MUGFETS.

SUMMARY

In view of the foregoing, disclosed herein are semiconductor structures with monocrystalline semiconductor fins, which are above a trench isolation region in a bulk semiconductor substrate and which can be incorporated into one or more semiconductor devices. Also disclosed herein are methods of forming such semiconductor structures. Specifically, to form the semiconductor structures, sidewall spacers can be formed on opposing sides of mandrels on a dielectric cap layer. Then, between adjacent mandrels, an opening can be formed that extends vertically through the dielectric cap layer, through multiple monocrystalline semiconductor layers and into a semiconductor substrate. Next, the portion of the opening in the substrate can be expanded to form a trench. This trench can undercut the semiconductor layers and, particularly, can extend laterally below adjacent sidewall spacers on either side of the opening. The trench can then be filled with an isolation layer, thereby forming a trench isolation region, and a sidewall image transfer process can be performed using the sidewall spacers to form a pair of monocrystalline semiconductor fins above the trench isolation region.

More particularly, disclosed herein are semiconductor structures. The semiconductor structures can each comprise a semiconductor substrate having a top surface and comprising a first semiconductor material, which is monocrystalline. The semiconductor structures can further each comprise a trench isolation region and a pair of monocrystalline semiconductor fins on the trench isolation region.

The trench isolation region can be in and at the top surface of the semiconductor substrate and can comprise a trench. In one semiconductor structure, the trench can be relatively deep and, particularly, can have a depth that is approximately equal to or greater than its width. In another semiconductor structure, a doped region can be positioned in the semiconductor substrate immediately adjacent to the bottom surface of the trench. During processing this doped region can limit vertical etching such that the trench has a relatively high aspect ratio with the depth of the trench being less than its width. In any case, the trench can be filled with an isolation layer.

The pair of monocrystalline semiconductor fins can be aligned above the trench isolation region and, specifically, can be immediately adjacent to the isolation layer. Each monocrystalline semiconductor fin can comprise, for example, a semiconductor layer immediately adjacent to the isolation layer and an additional semiconductor layer on the semiconductor layer. The semiconductor layer can comprise a second semiconductor material, which is monocrystalline and which is different from the first semiconductor material. The additional semiconductor layer can comprise either the first semiconductor material or a third semiconductor material, which is monocrystalline and which is different from the first and second semiconductor material.

Also disclosed herein are methods of forming the above-described semiconductor structures.

Specifically, a method of forming a semiconductor structure can comprise providing a bulk semiconductor substrate. The semiconductor substrate can comprise a first semiconductor material, which is monocrystalline. The method can further comprise forming multiple semiconductor layers above that substrate. The multiple semiconductor layers can comprise one semiconductor layer immediately adjacent to the top surface of the semiconductor substrate and an additional semiconductor layer on the semiconductor layer. The semiconductor layer can comprise a second semiconductor material, which is monocrystalline and which is different from the first semiconductor material. The additional semiconductor layer can comprise either the first semiconductor material or a third semiconductor material, which is monocrystalline and different from the first and second semiconductor materials. A dielectric cap layer can then be formed on the additional semiconductor layer.

After the dielectric cap layer is formed, mandrels can be formed on the dielectric cap layer. The mandrels can comprise, for example, a polycrystalline semiconductor material. After the mandrels are formed, dielectric sidewall spacers can be formed on opposing sides of the mandrels. Then, between adjacent mandrels, an opening can be formed that extends vertically through the dielectric cap layer and the multiple semiconductor layers into the semiconductor substrate. The portion of the opening within the semiconductor substrate can then be expanded to form a trench. This trench can undercut the semiconductor layer and, particularly, can extend laterally below adjacent sidewall spacers on either side of the opening. As a result of the techniques used to expand the lower portion of the opening, the resulting trench can be relatively deep and, particularly, can have a depth that is approximately equal to or greater than its width. The trench can then be filled with an isolation layer, thereby forming a trench isolation region.

After the trench isolation region is formed, a sidewall image transfer process can be performed using the sidewall spacers to form a pair of monocrystalline semiconductor fins above the trench isolation region immediately adjacent to the isolation layer. Additional processing can then be performed to form a semiconductor device comprising one or more of the previously formed monocrystalline semiconductor fins.

Another method of forming a semiconductor structure disclosed herein is similar to the method described above. However, this method can comprise an additional processing step that limits the depth of the trench. Specifically, this method can comprise providing a bulk semiconductor substrate. The semiconductor substrate can comprise a first semiconductor material, which is monocrystalline. The method can further comprise forming multiple semiconductor layers above that semiconductor substrate. The multiple semiconductor layers can comprise one semiconductor layer immediately adjacent to a top surface of the semiconductor substrate and an additional semiconductor layer on the semiconductor layer. The semiconductor layer can comprise a second semiconductor material, which is monocrystalline and which is different from the first semiconductor material. The additional semiconductor layer can comprise either the first semiconductor material or a third semiconductor material, which is monocrystalline and different from the first and second semiconductor materials. A dielectric cap layer can then be formed on the additional semiconductor layer.

After the dielectric cap layer is formed, mandrels can be formed on the dielectric cap layer. The mandrels can comprise, for example, a polycrystalline semiconductor material. After the mandrels are formed, dielectric sidewall spacers can be formed on opposing sides of the mandrels. Then, between adjacent mandrels, an opening can be formed that extends vertically through the dielectric cap layer and the multiple semiconductor layers into the semiconductor substrate. Next, a dopant can be implanted into the semiconductor substrate to form a doped region immediately adjacent to a bottom surface of the opening. The portion of the opening within the semiconductor substrate can then be expanded to form a trench in the semiconductor substrate. This trench can undercut the semiconductor layer and, particularly, can extend laterally below the adjacent sidewall spacers on either side of the opening. In this case, as a result of the doped region at the bottom surface of the opening, expansion of the portion of the opening within the semiconductor substrate in the vertical direction is limited such that the resulting trench will have a relatively high aspect ratio and, particularly, will have a depth that is less than its width. The trench can then be filled with an isolation layer, thereby forming a trench isolation region.

After the trench isolation region is formed, a sidewall image transfer process can be performed using the sidewall spacers to form a pair of monocrystalline semiconductor fins above the trench isolation region immediately adjacent to the isolation layer. Additional processing can then be performed to form a semiconductor device comprising one or more of the previously formed monocrystalline semiconductor fins.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, integrated circuit design decisions are often driven by device scalability, manufacturing efficiency and costs. For example, size scaling of a single-gate planar field effect transistor resulted in a smaller channel length and, unfortunately, the smaller channel length resulted in a corresponding increase in short channel effects and a decrease in drive current. In response, different types of multi-gate non-planar field effect transistors (MUGFETs), such as dual-gate non-planar FETs (also referred to herein as fin-type FETs (FINFETs)) and tri-gate non-planar FETs, comprising one or more semiconductor fins were developed in order to provide reduced-size field effect transistors, while simultaneously avoiding corresponding increases in short channel effects and decreases in drive current. Semiconductor fins for such MUGFETs are typically formed using semiconductor-on-insulator (SOI) wafers so that the insulator layer will provide electrical isolation between the semiconductor fins and the semiconductor substrate below. Unfortunately, the costs associated using SOI wafers can be relatively high, thereby limiting access to such advanced technologies. Therefore, there is a need in the art for a method of forming semiconductor fins for non-planar semiconductor device(s), such as MUGFETs, on bulk semiconductor substrate to lower costs and, thereby lower the access threshold for such MUGFETS.

In view of the foregoing, disclosed herein are semiconductor structures with monocrystalline semiconductor fins, which are above a trench isolation region in a bulk semiconductor substrate and which can be incorporated into one or more semiconductor devices. Also disclosed herein are methods of forming such semiconductor structures. Specifically, to form the semiconductor structures, sidewall spacers can be formed on opposing sides of mandrels on a dielectric layer. Then, between adjacent mandrels, an opening can be formed that extends vertically through the dielectric layer, through multiple monocrystalline semiconductor layers and into a semiconductor substrate. Next, the portion of the opening in the substrate can be expanded to form a trench. This trench can undercut the semiconductor layers and, particularly, can extend laterally below adjacent sidewall spacers on either side of the opening. The trench can then be filled with an isolation layer, thereby forming a trench isolation region, and a sidewall image transfer process can be performed using the sidewall spacers to form a pair of monocrystalline semiconductor fins above the trench isolation region.

Figure 1A:
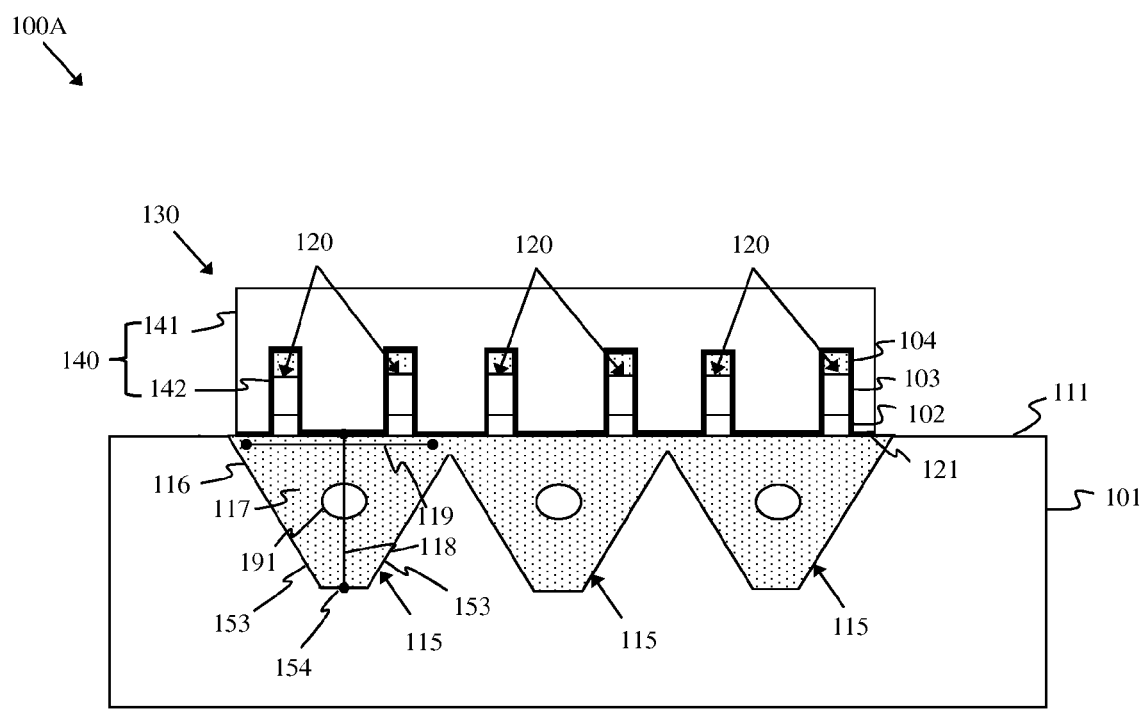
FIG. 1A is a cross-section drawing illustrating a disclosed semiconductor structure 100A having a pair of monocrystalline semiconductor fins on a trench isolation region in a bulk semiconductor substrate.
Figure 1B:
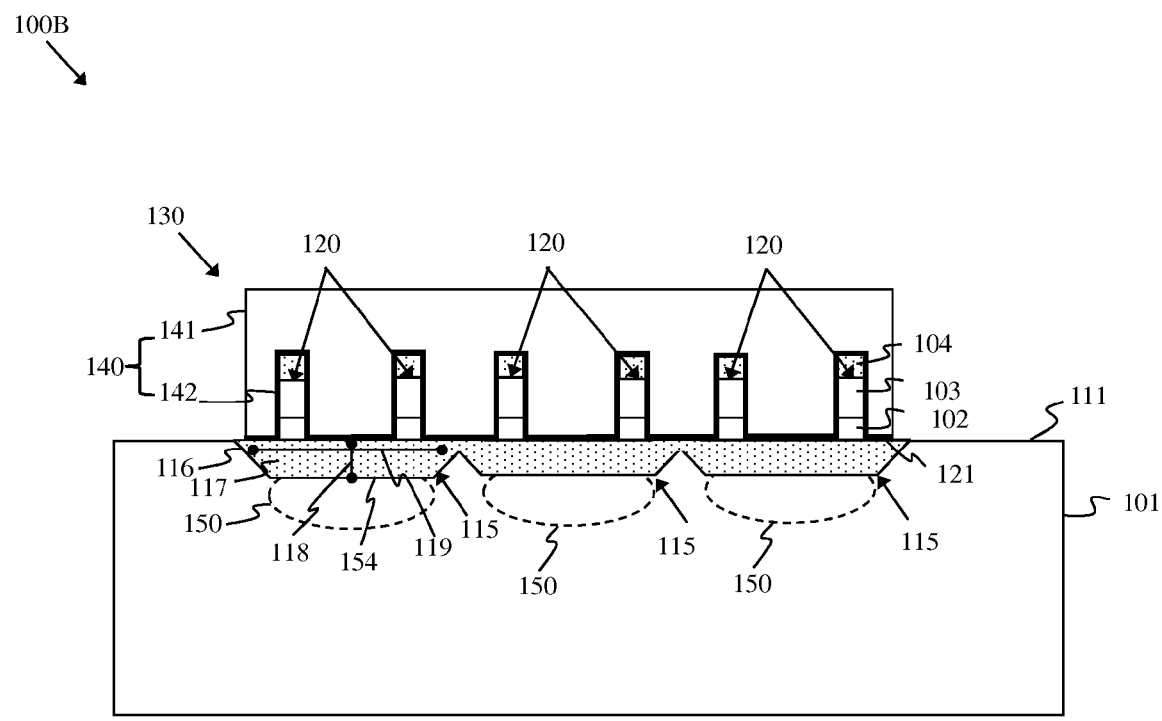
FIG. 1B is a cross-section drawing illustrating another disclosed semiconductor structure 100B having a pair of monocrystalline semiconductor fins on a trench isolation region in a bulk semiconductor substrate.

More particularly, referring to FIGS. 1A and 1B, disclosed herein are semiconductor structures 100A, 100B. The semiconductor structures 100A, 100B can each comprise a bulk semiconductor substrate 101. This bulk semiconductor substrate 101 can comprise a first semiconductor material and, particularly, a monocrystalline semiconductor material, such as monocrystalline silicon or any other suitable monocrystalline semiconductor material.

The semiconductor structures 100A, 100B can each further comprise a trench isolation region 115 at the top surface 111 of the bulk semiconductor substrate 101 and a pair of monocrystalline semiconductor fins 120 above the trench isolation region 115. Optionally, the semiconductor structures 100A, 100B can further comprise one or more additional trench isolation regions at the top surface 111 of the semiconductor substrate 101 and one or more additional pairs of semiconductor fins above the additional trench isolation region(s). For illustration purposes, the semiconductor structures 100A and 100B are shown in FIGS. 1A and 1B, respectively, with three trench isolation regions and three corresponding pairs of semiconductor fins above the trench isolation regions. However, it should be understood that the semiconductor structures 100A, 100B can comprise any number of one or more trench isolation regions and corresponding pairs of semiconductor fins thereon. As illustrated, when the semiconductor structures 100A, 100B comprise multiple trench isolation regions with corresponding pairs of semiconductor fins thereon, the trench isolation regions can be positioned laterally immediately adjacent to each other (i.e., can be merged) such that the trench isolation regions form an essentially continuous isolation region below the multiple pairs of semiconductor fins.

Each trench isolation region 115 can be in and at the top surface 111 of the semiconductor substrate 101 and can comprise a trench 116. As illustrated, the semiconductor structures 100A and 100B vary with regard to the trench 116.

Specifically, in the semiconductor structure 100A, as shown in FIG. 1A, this trench 116 can be relatively deep and, particularly, can have a depth 118, as measured from the top surface 111 of the semiconductor substrate 101 to the bottom surface 154 of the trench 116, that is approximately equal to or greater than its width 119. Furthermore, the opposing sidewalls 153 of the trench 116 can be angled relative to the top surface 111 of the semiconductor substrate 101, as opposed to being normal (i.e., perpendicular) relative to the top surface 111 of the semiconductor substrate 101. For example, the semiconductor fins 120 can be oriented in a <100> direction and the trench 116 can have {110}-faceted opposing sidewalls. The aspect ratio (i.e., depth-to-width) and the profile of the trench sidewalls can be due to the processing techniques used to form the trench 116, as discussed in greater detail below with regard to the methods disclosed herein.

Alternatively, in the semiconductor structure 100B, as shown in FIG. 1B, the trench 116 can be relatively shallow with a relatively high aspect ratio (i.e., the depth 118 of the trench is less than its width 119). More specifically, the semiconductor substrate 101 can further comprise a doped region 150 (i.e., a dopant implant region), which is immediately adjacent to the bottom surface 154 of the trench 116, but not adjacent to the sidewalls of the trench 116. During processing, as discussed in greater detail below with regard to the methods disclosed herein, the doped region 150 could be formed using a dopant implantation process that changes the chemical composition and/or the crystalline structure of the doped region 150 relative to the remaining portion of the semiconductor substrate 101. As a result, a selective etch process can be performed to expand the trench 116 laterally but not vertically. For example, if the semiconductor substrate 101 comprises silicon, the dopant implanted into the doped region 150 can comprise germanium. In this case, the silicon can be selectively etched over the silicon germanium in doped region 150 to expand the trench 116 laterally but not vertically. Alternatively, the dopant implanted into the doped region 150 can comprise an inert dopant (e.g., silicon, argon, krypton, nitrogen, xenon, neon, carbon, etc.) that amorphizes the doped region 150 (i.e., ensures that the doped region 150 has an amorphous crystalline structure). In this case, the monocrystalline semiconductor material can be selectively etched over the amorphous semiconductor material in the doped region 150 to expand the trench 116 laterally but not vertically. Since the doped region 150 limits vertical etching during processing, the trench 116 has a relatively high aspect ratio with its depth 118 being less than its width 119. It should be noted that, if during processing, etching to expand the trench 116 laterally extends beyond the limits of the doped region 150, the edge portions of the trench 116 may extend deep into the semiconductor substrate 101 than the center portion (not shown). Furthermore, although the trench 116 in the semiconductor structure 100B is relatively shallow, the sidewalls 153 of the trench 116 can, due to the processing techniques used, be angled relative to the top surface 111 of the semiconductor substrate 101, as opposed to being normal (i.e., perpendicular) relative to the top surface 111 of the semiconductor substrate 101. For example, the semiconductor fins 120 can be oriented in a <100> direction and the trench 116 can have {110}-faceted opposing sidewalls.

It should be noted that a conventional shallow trench isolation (STI) region with essentially vertical sidewalls (not shown) may define and, particularly, laterally surround the region of the bulk semiconductor substrate 101 within which the semiconductor structures 100A, 100B are formed. Conventional STI regions are well known in the art and, thus, the details are omitted form this specification in order to allow the reader to focus on the salient aspect of the disclosed structures. If such an STI region is present, lateral etching performed during processing to form each trench 116, as discussed in greater detail below with regard to the methods, may be stopped in a given lateral direction by the STI region. In this case, a trench 116 that is positioned laterally immediately adjacent to the STI region may have opposing sidewalls 153 that are asymmetric with the sidewall closest to the STI being essentially vertical and the opposite sidewall being faceted, as described above.

In any case, the trench 116 in the trench isolation region 115 of the semiconductor structures 100A, 100B can be filled with one or more isolation layers 117. The top surface 121 of the isolation layer(s) 117 can be essentially co-planar with the top surface 111 of the semiconductor substrate 101. The isolation layer(s) 117 can comprise silicon dioxide or any other suitable isolation material. It should be noted that, as a function of the aspect ratio of the trench 116 and the processing technique used to fill the trench 116 with the isolation layer 117, the trench isolation region 115 may comprise one or more air gaps 191 (i.e., air bubbles, voids, etc.) within the isolation layer 117 in the trench 116, as shown in FIG. 1A.

The pair of monocrystalline semiconductor fins 120 can be aligned above the trench isolation region 115 and, particularly, can be immediately adjacent to the top surface 121 of the isolation layer(s) 117 contained therein. Specifically, these monocrystalline semiconductor fins 120 can be relatively thin, essentially rectangular-shaped (i.e., fin-shaped), parallel bodies that extend vertically from the top surface 121 of the isolation layer(s) 117 of the trench isolation region 115. The pair of semiconductor fins 120 and, particularly, the space between the pair of semiconductor fins 120 can be centered on the trench isolation region 115. Each semiconductor fin 120 can comprise, for example, a semiconductor layer 102 immediately adjacent to the top surface 121 of the isolation layer(s) 117 and an additional semiconductor layer 103 on the semiconductor layer 102.

The semiconductor layer 102 can comprise a second semiconductor material, which is monocrystalline and which is different from the first semiconductor material. The difference between the first semiconductor material and second semiconductor material can be, for example, a difference in chemical composition such that the first semiconductor material can be selectively etched over the second semiconductor material during processing. For example, if the first semiconductor material of the semiconductor substrate 101 comprises monocrystalline silicon, the second semiconductor material of the lower portion of each semiconductor fin 120 can comprise monocrystalline silicon germanium, carbon-doped monocrystalline silicon, carbon-doped monocrystalline silicon germanium carbide, or any other suitable monocrystalline semiconductor material.

The additional semiconductor layer 103 can be above and immediately adjacent to the semiconductor layer 102. This additional semiconductor layer 103 can comprise the first semiconductor material (i.e., the same semiconductor material as the semiconductor substrate 101). Alternatively, the additional semiconductor layer 103 can comprise a third semiconductor material, which is similarly monocrystalline and which is different from the first and second semiconductor material. For example, if the first semiconductor material of the semiconductor substrate 101 comprises monocrystalline silicon and the second semiconductor material of the semiconductor layer 102 comprises monocrystalline silicon germanium, the additional semiconductor layer 103 can comprise either monocrystalline silicon, a silicon alloy other than silicon germanium, silicon germanium with a different germanium concentration, etc.

In any case, the semiconductor layer 102 may be relatively thin as compared to the additional semiconductor layer 103. Furthermore, the multiple semiconductor layers 102-103 can each be relatively thin as compared to the semiconductor substrate 101.

Optionally, a dielectric cap layer 104 can be positioned on the top surface of each semiconductor fin 120 (e.g., adjacent to the additional semiconductor layer 103). This dielectric cap layer 104 can comprise, for example, a silicon dioxide cap layer or any other suitable dielectric cap layer.

The semiconductor structures 100A, 100B can further comprise one or more semiconductor devices 130 and each semiconductor device 130 can comprise one or more of the semiconductor fins 120. For example, as illustrated, the semiconductor device 130 can comprise a MUGFET and, particularly, a FINFET comprising one or more of the semiconductor fin(s) 120 and a gate structure 140 that traverses the semiconductor fin(s) 120. That is, each semiconductor fin 120 can comprise a channel region positioned laterally between source/drain regions and the gate structure 140 can traverse the semiconductor fin(s) such that it is positioned on one of the opposing sidewalls of the semiconductor fin(s) 120 adjacent to the channel region(s). This gate structure 140 can comprise, for example, a gate dielectric layer 142 (e.g., a silicon dioxide gate dielectric layer, a high-k gate dielectric layer or any other suitable gate dielectric layer) conformally deposited over the semiconductor fin(s) 120 and a gate conductor layer 141 (e.g., a doped polysilicon gate conductor layer, a metal gate conductor layer or any other suitable gate conductor layer) on the gate dielectric layer 142. Alternatively, in the absence of a dielectric cap layer 104 (not shown), the semiconductor device 130 can comprise a tri-gate non-planar FET that incorporates one or more of the semiconductor fins 120, as described above. Alternatively, the semiconductor device 130 can comprise any other type of semiconductor device (e.g., a resistor, a diode, etc.) that can incorporate one or more semiconductor fins.

Figure 2:
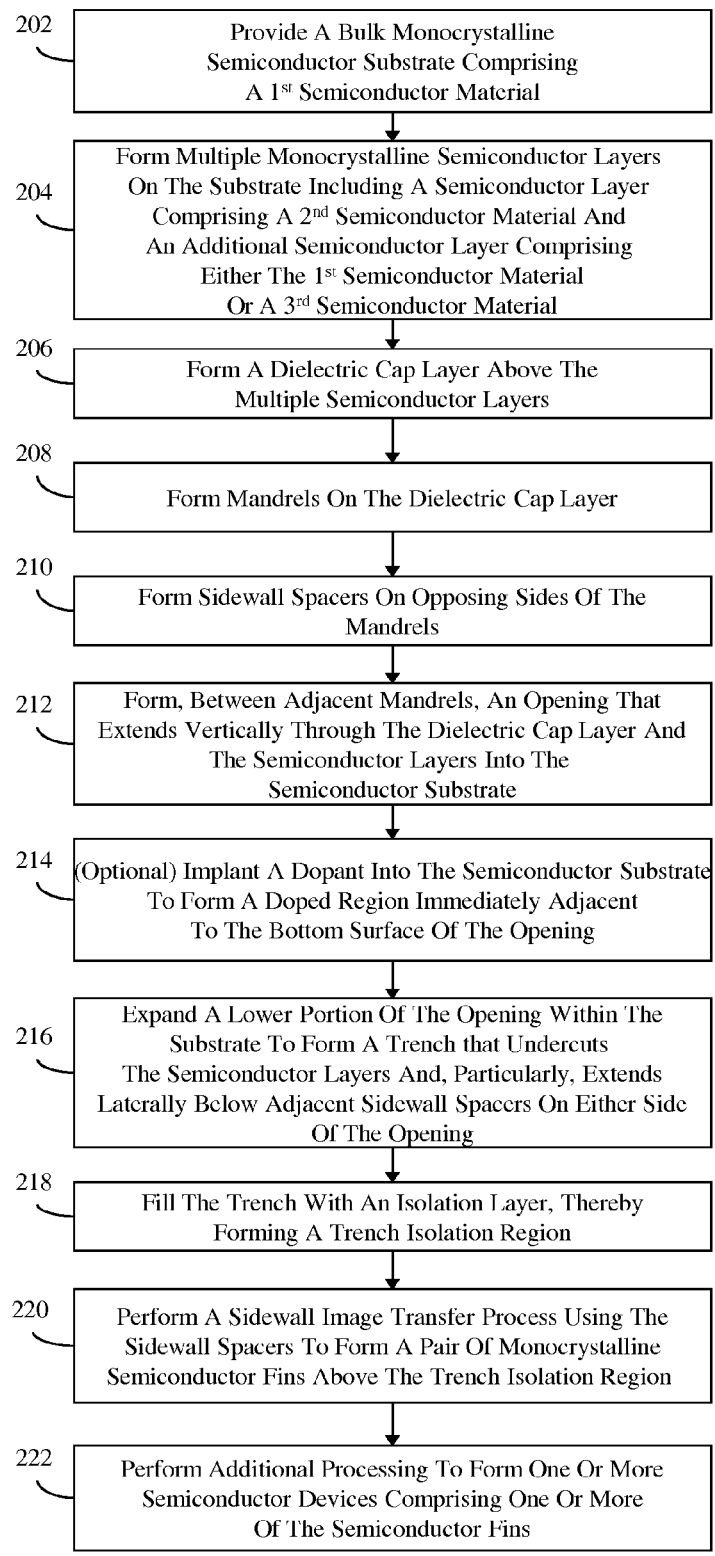
FIG. 2 is a flow diagram illustrating the disclosed methods for forming the semiconductor structures of FIGS. 1A-1B.

Referring to the flow diagram of FIG. 2, also disclosed herein are methods of forming the above-described semiconductor structures 100A and 100B of FIGS. 1A and 1B, respectively.

Figure 3:
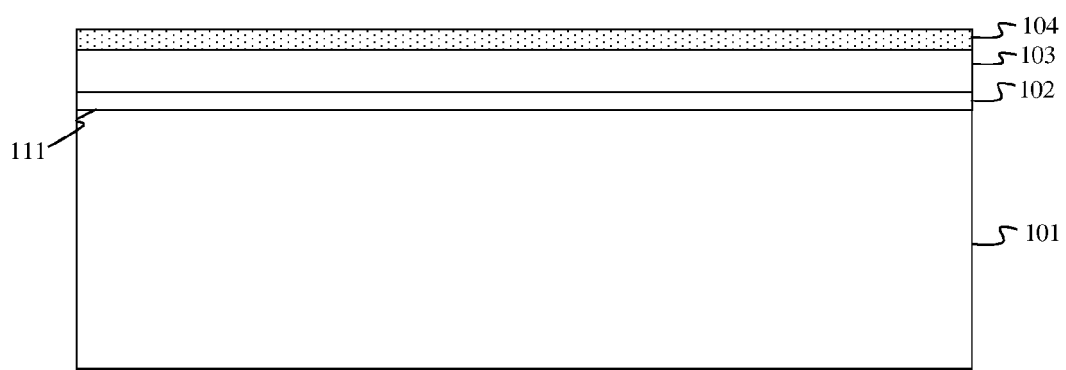
FIG. 3 is a cross-section diagram illustrating a partially completed semiconductor structure 100A or 100B formed according to the flow diagram of FIG. 2.

Specifically, the methods of forming the semiconductor structures 100A, 100B can comprise providing a bulk semiconductor substrate 101 (step 202, see FIG. 3). This bulk semiconductor substrate 101 can comprise a first semiconductor material and, particularly, a monocrystalline semiconductor material, such as monocrystalline silicon or any other suitable monocrystalline semiconductor material. This bulk semiconductor substrate 101 can have a top surface 111.

The methods can further comprise forming multiple semiconductor layers 102-103 above that bulk semiconductor substrate 101 (step 204, see FIG. 3). Specifically, the multiple semiconductor layers can comprise one semiconductor layer 102 formed immediately adjacent to the top surface 111 of the semiconductor substrate 101 and an additional semiconductor layer 103 formed on the semiconductor layer 102.

The semiconductor layer 102 can comprise a second semiconductor material, which is monocrystalline and which is different from the first semiconductor material of the semiconductor substrate 101. The difference between the first semiconductor material and second semiconductor material can be, for example, a difference in chemical composition such that the first semiconductor material can be selectively etched over the second semiconductor material. For example, if the first semiconductor material of the semiconductor substrate 101 comprises monocrystalline silicon, the second semiconductor material of the semiconductor layer 102 can comprise monocrystalline silicon germanium, carbon-doped monocrystalline silicon, carbon-doped monocrystalline silicon germanium carbide, or any other suitable monocrystalline semiconductor material.

The additional semiconductor layer 103 can comprise the first semiconductor material (i.e., the same semiconductor material as the semiconductor substrate 101). Alternatively, the additional semiconductor layer 103 can comprise a third semiconductor material, which is similarly monocrystalline and which is different from the first and second semiconductor material. For example, if the first semiconductor material of the semiconductor substrate 101 comprises monocrystalline silicon and the second semiconductor material of the semiconductor layer comprises monocrystalline silicon germanium, the additional semiconductor layer 103 can comprise either monocrystalline silicon, a silicon alloy other than silicon germanium, silicon germanium with a different germanium concentration, etc.

The multiple semiconductor layers 102-103 can be formed at process 204 using, for example, conventional epitaxial deposition processes and, if necessary, dopant implantation processes. In any case, multiple semiconductor layers 102 may be formed such that the semiconductor layer 102 is relatively thin as compared to the additional semiconductor layer 103. Furthermore, the multiple semiconductor layers 102-103 may further be formed so that they are each relatively thin as compared to the semiconductor substrate 101.

Once the multiple semiconductor layers 102-103 are formed, a dielectric cap layer 104 can be formed on the additional semiconductor layer 103 (206, see FIG. 3). This dielectric cap layer 104 can comprise, for example, a silicon dioxide cap layer or any other suitable dielectric cap layer and can be formed at process 206 using, for example, a thermal oxidation process or chemical vapor deposition (CVD) process.

Figure 4A:
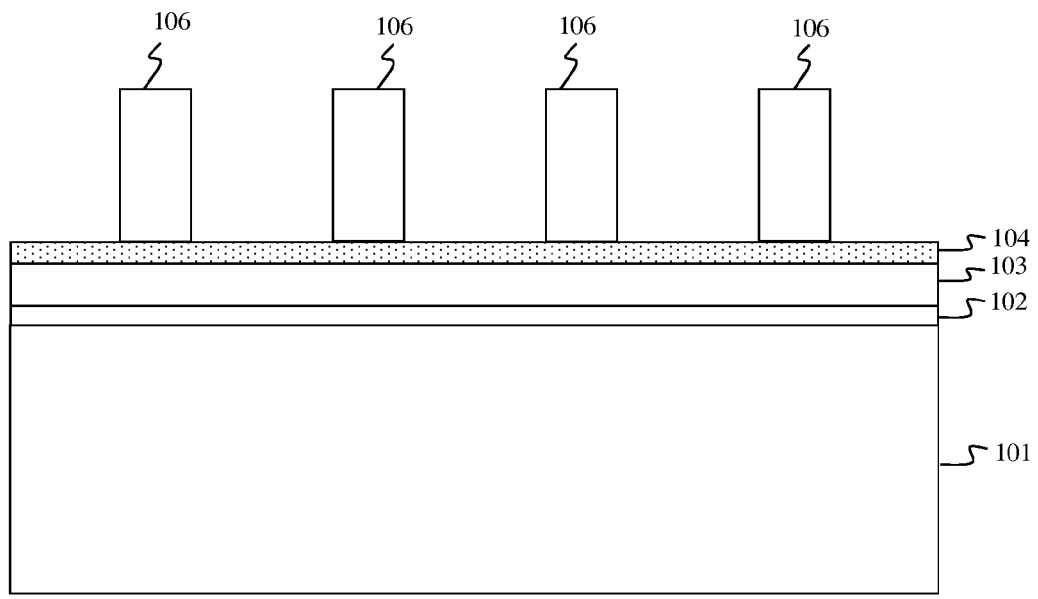
FIG. 4A is a cross-section diagram illustrating a partially completed semiconductor structure 100A or 100B formed according to the flow diagram of FIG. 2.
Figure 4B:
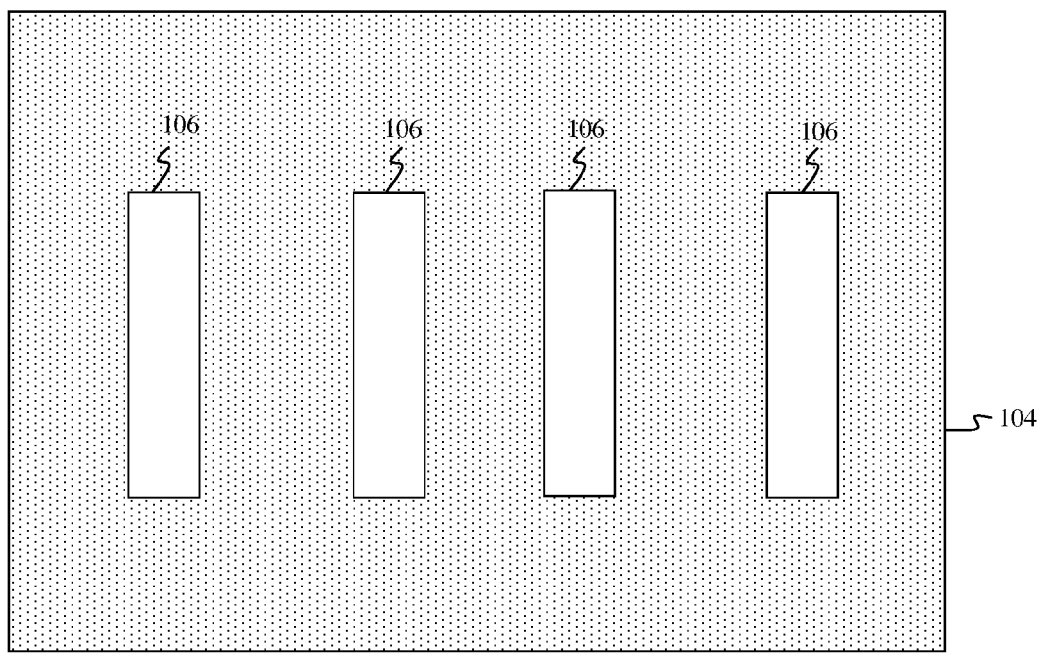
FIG. 4B is a top view diagram illustrating the same partially completed semiconductor structure as shown in FIG. 4A.

After the dielectric cap layer 104 is formed, mandrels 106 can be formed on the dielectric cap layer 104 (208, see FIGS. 4A-4B). The mandrels 106 can comprise, for example, a polycrystalline semiconductor material, such as polysilicon or any other suitable mandrel material. The mandrels 106 can be formed, for example, by depositing a mandrel material layer on the dielectric cap layer 104. The mandrel layer can then be lithographically patterned and etched to form discrete mandrels 106 above the dielectric cap layer 104. For purposes of this disclosure, a mandrel is an essentially rectangular-shaped body. The spacing between mandrels 106 as well as width of each mandrel can be predetermined to achieve a desired spacing between semiconductor fins subsequently formed using a sidewall image transfer technique at process 220, as discussed in greater detail below. For purposes of illustration, three mandrels are shown; however, it should be understood that any number of two or more adjacent mandrels could be formed at process 208. These mandrels can, for example, be patterned such that they are oriented in the <100> direction.

Figure 5:
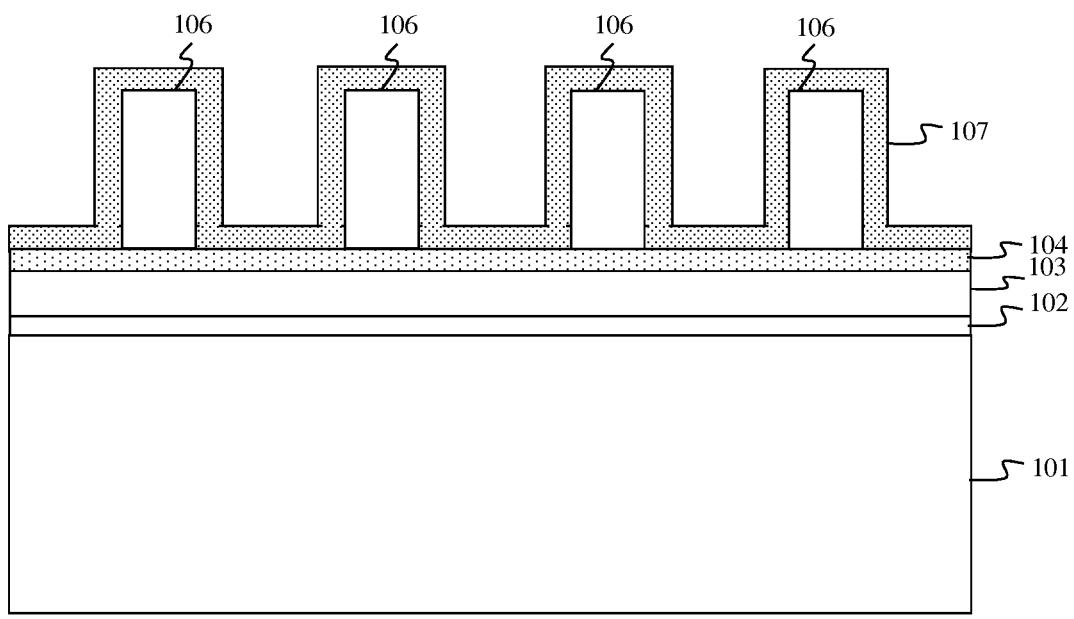
FIG. 5 is a cross-section diagram illustrating a partially completed semiconductor structure 100A or 100B formed according to the flow diagram of FIG. 2.
Figure 6:
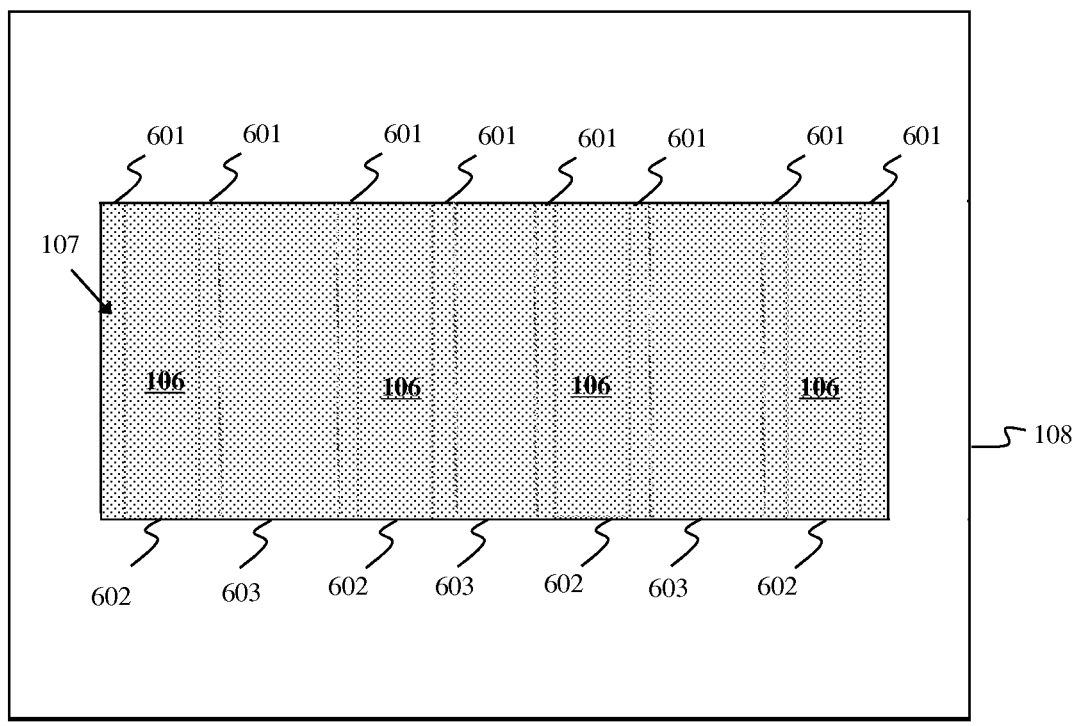
FIG. 6 is a top view diagram illustrating a partially completed semiconductor structure 100A or 100B formed according to the flow diagram of FIG. 2.
Figure 7A:
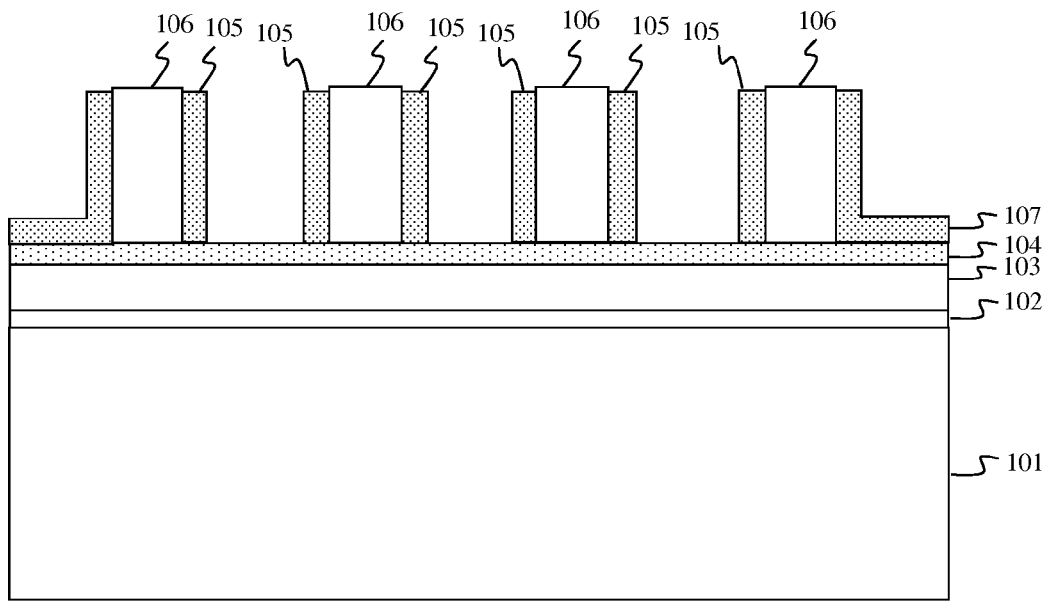
FIG. 7A is a cross-section diagram illustrating a partially completed semiconductor structure 100A or 100B formed according to the flow diagram of FIG. 2.
Figure 7B:
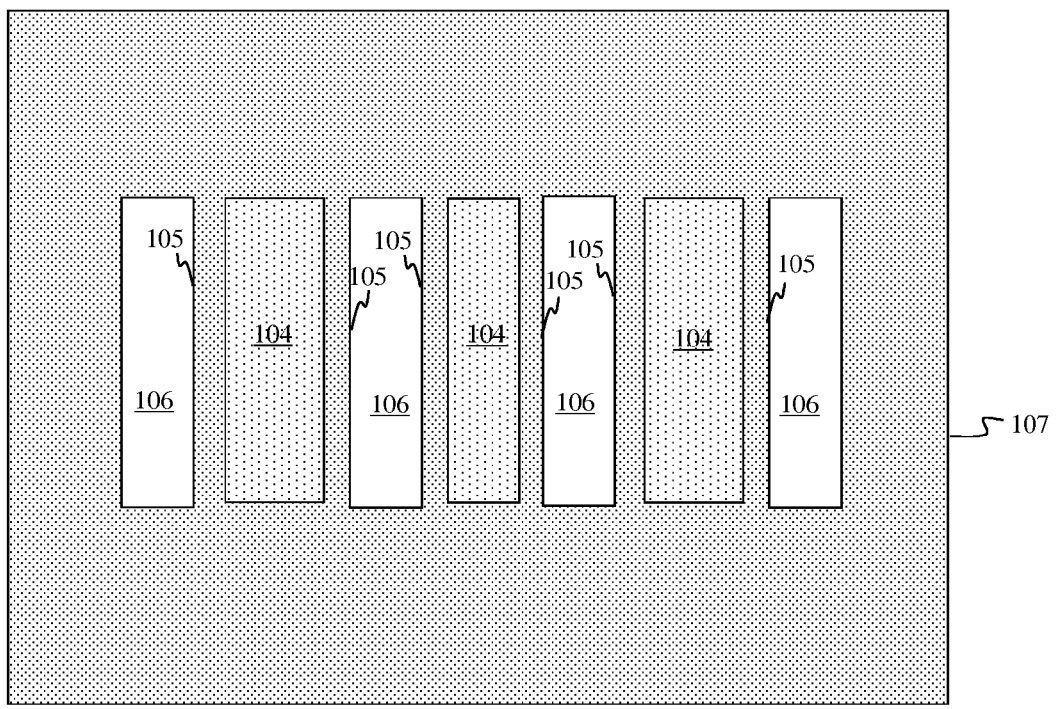
FIG. 7B is a top view diagram illustrating the same partially completed semiconductor structure as shown in FIG. 7A.

After the mandrels are formed, dielectric sidewall spacers 105 can be formed on opposing sides of the mandrels 106 (210, see FIGS. 7A-7B). Specifically, to form the dielectric sidewall spacers 105, an additional dielectric layer 107 can be conformally deposited (e.g., by chemical vapor deposition (CVD) or another suitable deposition method) over the mandrels 106 and onto the exposed surfaces of the dielectric cap layer 104 adjacent to the mandrels 106 (see FIG. 5). This additional dielectric layer 107 can comprise a different dielectric material than the dielectric cap layer 104. For example, if the dielectric cap layer 104 comprises silicon dioxide, the additional dielectric layer 107 can comprise silicon nitride, silicon oxynitride or any other suitable dielectric material. Next, a mask 108 (e.g., a photo resist layer) can be formed on the additional dielectric layer 107 so that only vertical portions 601 of the additional dielectric layer 107 on the opposing sides of the mandrels 106 in the <100> direction, first horizontal portions 602 of the additional dielectric layer 107 on the top surfaces of the mandrels 106 and second horizontal portions 603 of the additional dielectric layer 107 between the mandrels 106 are exposed (see FIG. 6). Next, an anisotropic etch process can be performed in order to remove the horizontal portions 602-603 of the additional dielectric layer from the top surface of the mandrels 106 and from between the mandrels 106, thereby exposing the top surface of the mandrels 106 and portions of the dielectric cap layer 104 between the mandrels 106 (see FIGS. 7A-7B). Following sidewall spacer 105 formation, the mask 108 can be removed.

Figure 8A:
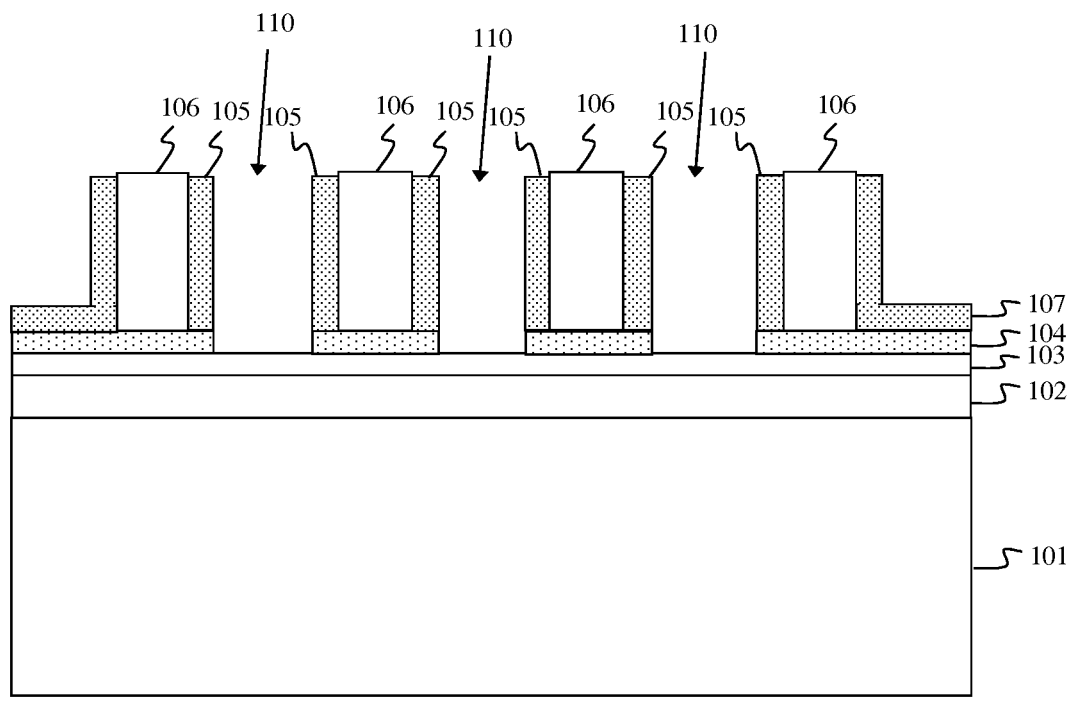
FIG. 8A is a cross-section diagram illustrating a partially completed semiconductor structure 100A or 100B formed according to the flow diagram of FIG. 2.
Figure 8B:
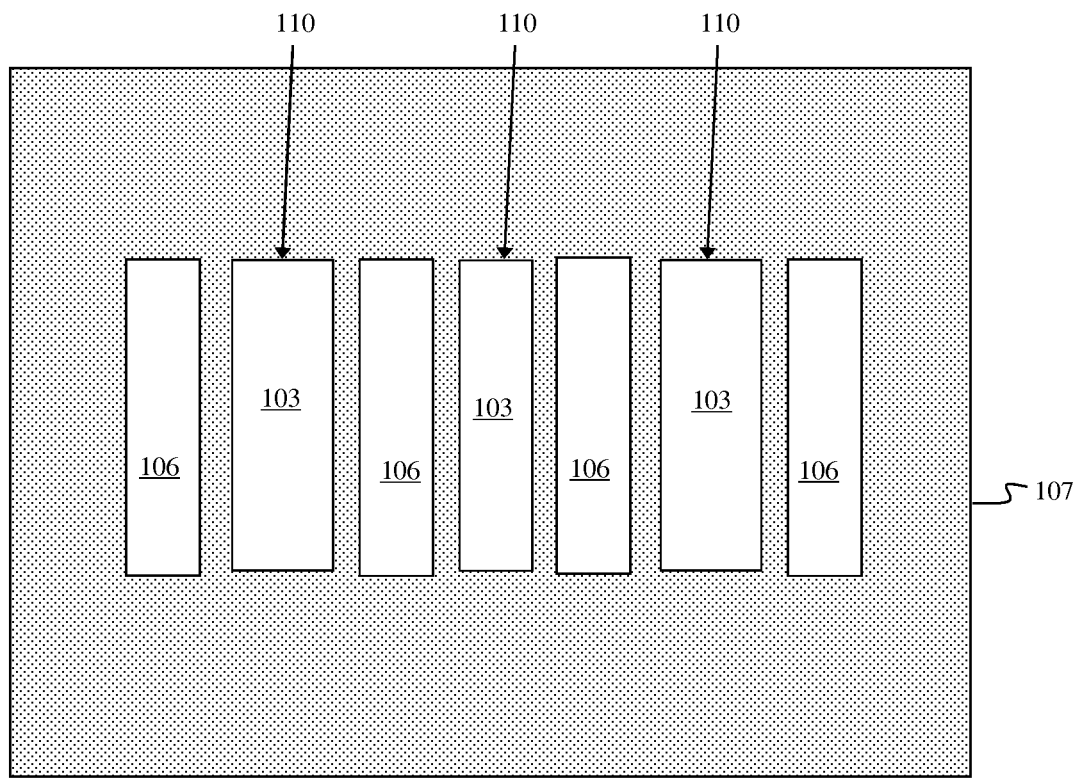
FIG. 8B is a top view diagram illustrating the same partially completed semiconductor structure as shown in FIG. 8A.
Figure 9:
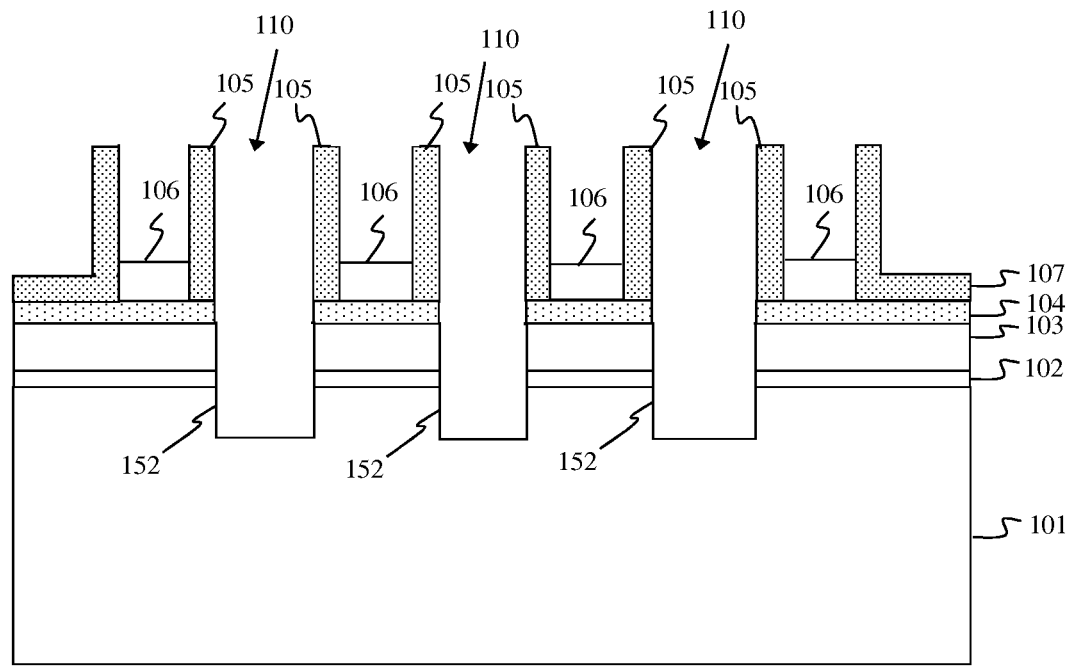
FIG. 9 is a cross-section diagram illustrating a partially completed semiconductor structure 100A or 100B formed according to the flow diagram of FIG. 2.

Next, between each pair of adjacent mandrels, an opening 110 can be formed that extends vertically through the dielectric cap layer 104 and the multiple semiconductor layers 102-103 into the semiconductor substrate 101 (212, see FIG. 9). Specifically, a first etch process can be performed in order to removed the exposed portion(s) of the dielectric cap layer 104 from between each pair of adjacent mandrels 106, thereby exposing corresponding portions of the additional semiconductor layer 103 below (see FIGS. 8A-8B). Then, a second etch process and, particularly, an anisotropic etch process in, for example, to further extend the opening 110 through the semiconductor layers 102-103 and further into the semiconductor substrate 101 some predetermined depth so as to expose vertical surfaces 152 of the semiconductor substrate 101 (see FIG. 9). It should be noted that, since, as mentioned above, the mandrels 106 may comprise polysilicon or some other suitable polycrystalline semiconductor material, the mandrels 106 may simultaneously be etched back as a result of this second etch process.

Figure 10:
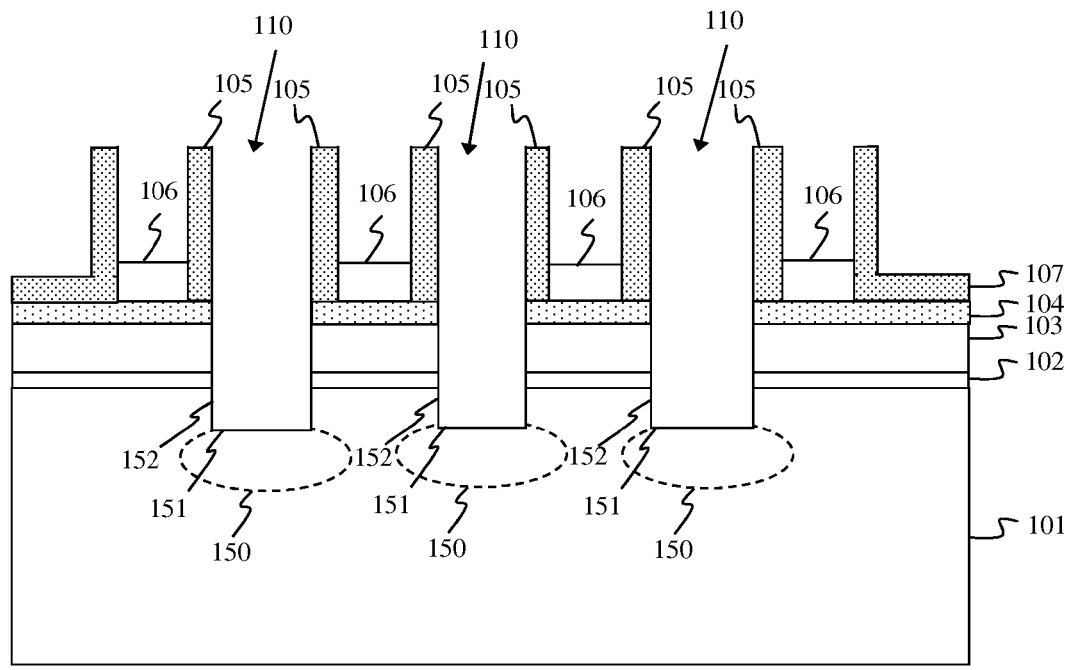
FIG. 10 is a cross-section diagram illustrating a partially completed semiconductor structure 100B formed according to the flow diagram of FIG. 2.

Optionally, after each opening 110 is formed at process 212 between each pair of adjacent mandrels 106, a dopant can be implanted into the semiconductor substrate 101 to form a doped region 150 immediately adjacent to the bottom surface 151 of the opening(s) 110 (214, see FIG. 10). More specifically, the doped region(s) 150 (i.e., dopant implant region(s)) can be formed (e.g., using a conventional dopant implantation technique) such that each doped region 150 is immediately adjacent to the bottom surface 151 of its corresponding opening 110, but not adjacent to the exposed vertical surfaces 152 of the semiconductor substrate 101 within the opening. The dopant used can specifically be selected so as to change the chemical composition and/or the crystalline structure of the doped region(s) 150 relative to the remaining semiconductor substrate 101. For example, if the semiconductor substrate 101 comprises silicon, the dopant implanted into the doped region(s) 150 can comprise germanium. Alternatively, the dopant implanted into the doped region(s) 150 can comprise an inert dopant (e.g., silicon, argon, krypton, nitrogen, xenon, neon, carbon, etc.) that amorphizes the doped region(s) 150 (i.e., ensures that the doped region(s) 150 has an amorphous crystalline structure).

Figure 11A:
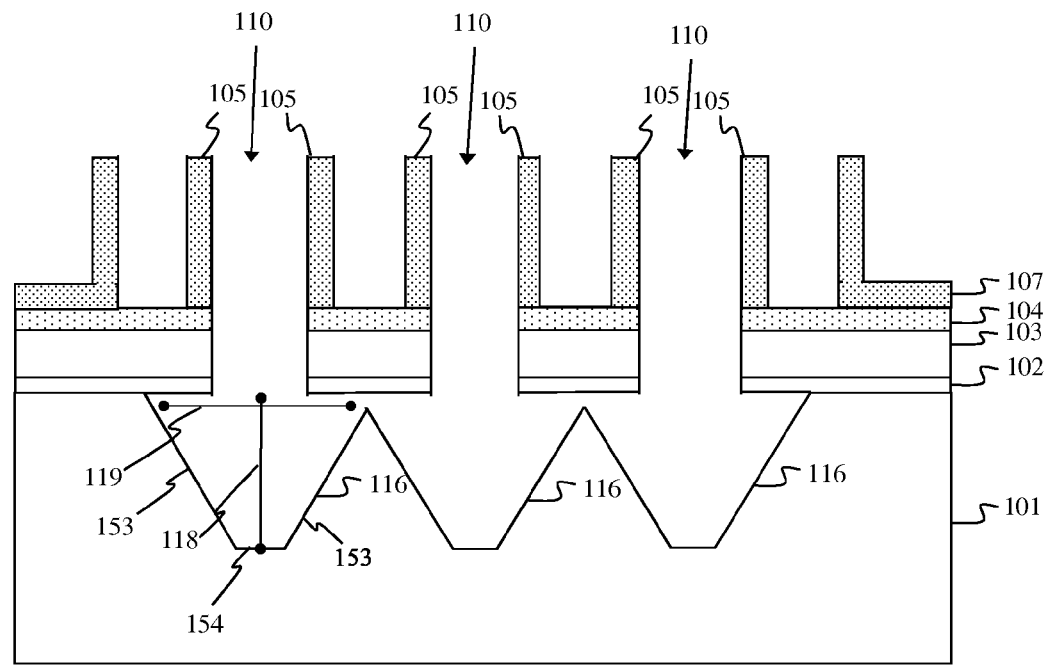
FIG. 11A is a cross-section diagram illustrating a partially completed semiconductor structure 100A formed according to the flow diagram of FIG. 2.
Figure 11B:
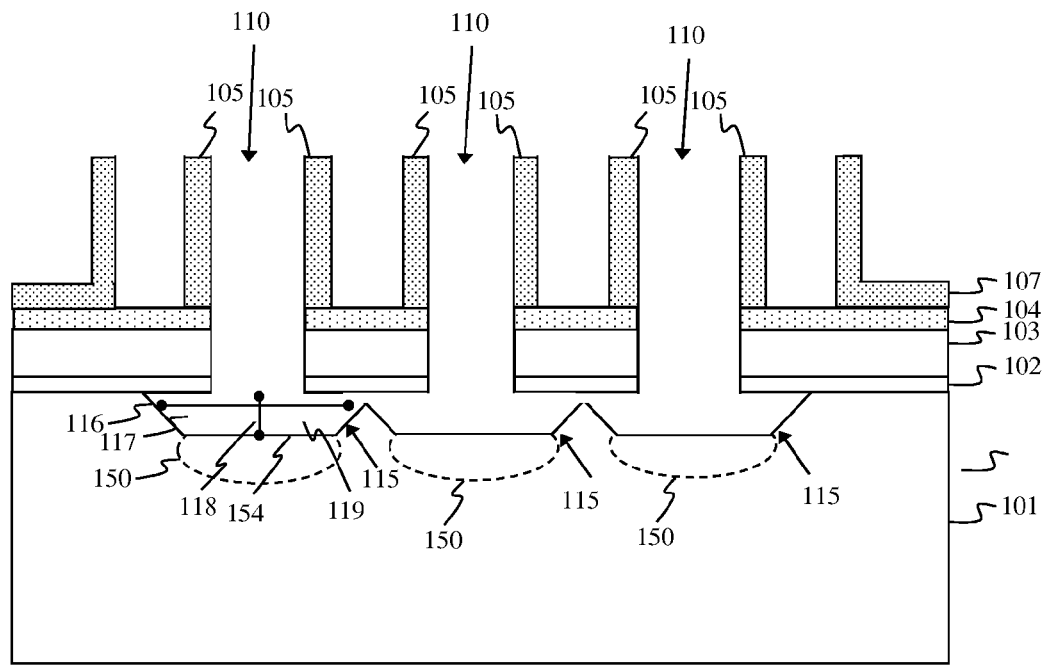
FIG. 11B is a cross-section diagram illustrating a partially completed semiconductor structure 100B formed according to the flow diagram of FIG. 2.

Next, the portion of each opening 110 within the semiconductor substrate 101 can then be expanded to form trench(es) 116 using, for example, an etch process having etch selectivity for the first semiconductor material over the second semiconductor material (216, see FIGS. 11A and 11B). Each trench 116 can undercut the semiconductor layer 102 and, particularly, can extend laterally below adjacent sidewall spacers 105 on either side of the corresponding opening 110. The expansion of the portion of each opening 110 within the semiconductor substrate 101 can further be performed such that the resulting adjacent trenches are positioned laterally immediately adjacent to each other (i.e., merged).

In the case where the semiconductor substrate 101 comprises silicon and the semiconductor layer 102 comprises silicon germanium, an etch process which is selective for the silicon of the semiconductor substrate 101 over the silicon germanium of the semiconductor layer 102 can be performed at process 216. For example, a crystallographic etch process and, particularly, a wet chemical etching process that uses an etchant, such as tetramethylammonium hydroxide (TMAH), ammonium hydroxide ($NH_4OH$), ethylenediamine pyrocatechol (EDP), potassium hydroxide (KOH), or any other suitable etchant capable of etching silicon over silicon germanium. Those skilled in the art will recognize that alternative etchants could be used depending upon the chemical differences between the semiconductor substrate 101 and the semiconductor layer 102.

In the case, where the material at both the vertical surfaces 152 and bottom surface 151 of the opening(s) 110 within the semiconductor substrate 101 are the same semiconductor material (e.g., silicon), this selective etch process will be essentially isotropic. That is, etching of the semiconductor substrate 101 will occur at essentially the same rate both vertically and laterally. Thus, the resulting trench(es) 116 may have a depth 118, as measured from the top surface 111 of the semiconductor substrate 101 to the bottom surface 154 of the trench, that is approximately equal to or greater than its width 119, as shown in FIG. 11A. It should be understood that the aspect ratio of the trench(es) 116 will vary as a function of the starting depth of the opening 110.

However, in the case where the semiconductor substrate 101 comprises doped region(s) 150 (i.e., dopant implant region(s)) immediately adjacent to the bottom surface 151 of each opening 110, but not the vertical surfaces 152 thereof, this selective etch process can also selectively etch the semiconductor material (e.g., silicon) at the vertical surfaces 152 over the different semiconductor material of the doped region 150 (e.g., silicon germanium, amorphous silicon, etc.) such that the resulting trench(es) 116 are expanded laterally, but not vertically. That is, the doped region(s) 150 limit vertical etching such that each trench 116 will have a relatively high aspect ratio with its depth 118 being less than its width 119, as shown in FIG. 11B. If lateral etching to expand the trench(es) 116 continues beyond the limits of the doped region(s) 150, then the edge portions of the trench(es) 116 may extend deeper into the semiconductor substrate 101 than the center portion (not shown).

It should be noted that in either case, if the mandrels 106 and sidewall spacers 105 are oriented in <100> directions, as mentioned above, such that the opening 110 is also oriented in a <100> direction, the trench(es) 116 will be etched so as to have {110}-faceted opposing sidewalls 153. It should also be noted that because of the mask 108 formed over select portions of the additional dielectric layer 107 during sidewall spacer 105 formation at process 210, those areas which appear to be floating above adjacent trenches 116 in FIGS. 11A-11B will be supported in the third dimension (i.e., along the z-axis) (not shown).

As mentioned above, the additional semiconductor layer 103 may comprise the same first semiconductor material as the semiconductor substrate 101. In this case, lateral etching of the vertical surfaces of the portion of each opening 110 within the additional semiconductor layer 103 will be relatively slow as compared to lateral etching of the vertical surfaces of the portion of each opening 110 within the semiconductor substrate 101 because the height of the vertical surfaces within the additional semiconductor layer 103 is relatively small as compared to the height of the vertical surfaces within the semiconductor substrate 101. This is due to the fact that it is easier to form a slow etch plane in a very thin layer of semiconductor material compared to a thick layer of the same semiconductor material. Thus, there may be no need to protect the vertical surfaces of the additional semiconductor layer 103 at process 216. However, if the lateral etch of the relatively thin additional semiconductor layer 103 is not tolerable, after the opening(s) 110 are extended through the additional semiconductor layer 103, but before they are extended through the semiconductor 102, additional sidewall spacers (not shown), such as silicon dioxide sidewall spacers, can be formed (e.g., using conventional sidewall spacer formation techniques) within the opening(s) 110 positioned laterally adjacent to exposed vertical surfaces of the additional semiconductor layer. These additional sidewall spacers can protect the additional semiconductor layer 103 from lateral etching at process 216 and, then, following process 216 and before the trench isolation region(s) 115 are formed at process 218, these additional sidewall spacers can be selectively removed.

Also, it should be noted that, prior to the formation of the semiconductor layers 102-103 at process 204, a conventional shallow trench isolation (STI) region with essentially vertical sidewalls (not shown) can be formed so as to define and, particularly, laterally surround the region of the bulk semiconductor substrate 101 within which the semiconductor structures 100A, 100B are to be formed. Techniques for forming such a conventional STI region are well known in the art and, thus, the details are omitted form this specification in order to allow the reader to focus on the salient aspect of the disclosed method. If such an STI region is formed, lateral etching may be stopped in a given direction by the STI region. In this case, a trench 116 formed immediately adjacent to the STI region may have opposing sidewalls 153 that are asymmetric with the sidewall closest to the STI being essentially vertical and the opposite sidewall being faceted, as described above.

For purposes of illustration, the remaining process steps will be illustrated with respect to the partially completed semiconductor structure shown in FIG. 11A. However, it should be understood that these same process steps may, alternatively, be performed in conjunction with the partially completed semiconductor structure shown in FIG. 11B.

Figure 12:
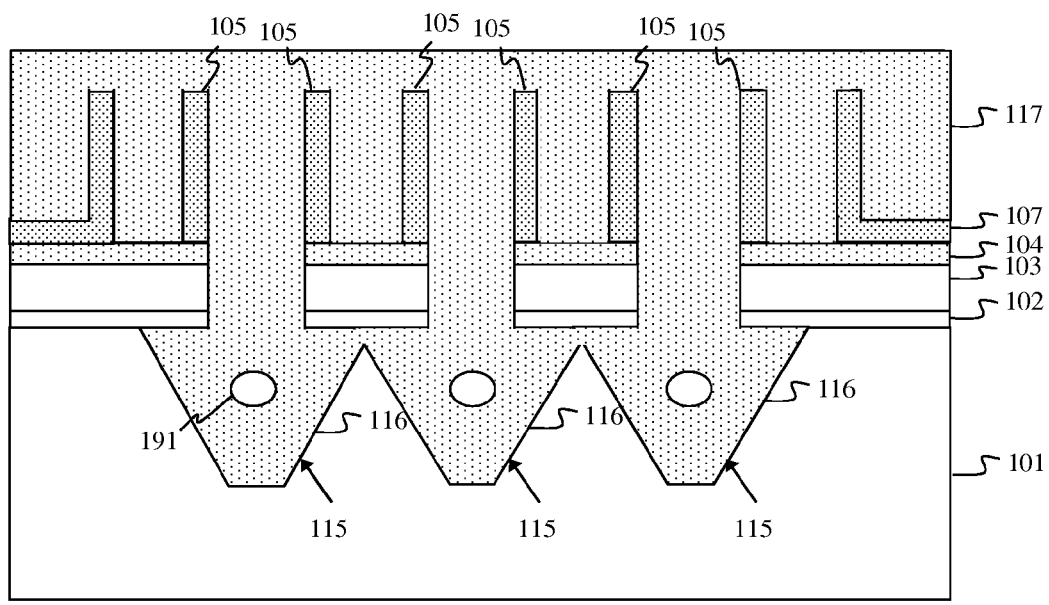
FIG. 12 is a cross-section diagram illustrating a partially completed semiconductor structure 100A formed according to the flow diagram of FIG. 2.
Figure 13:
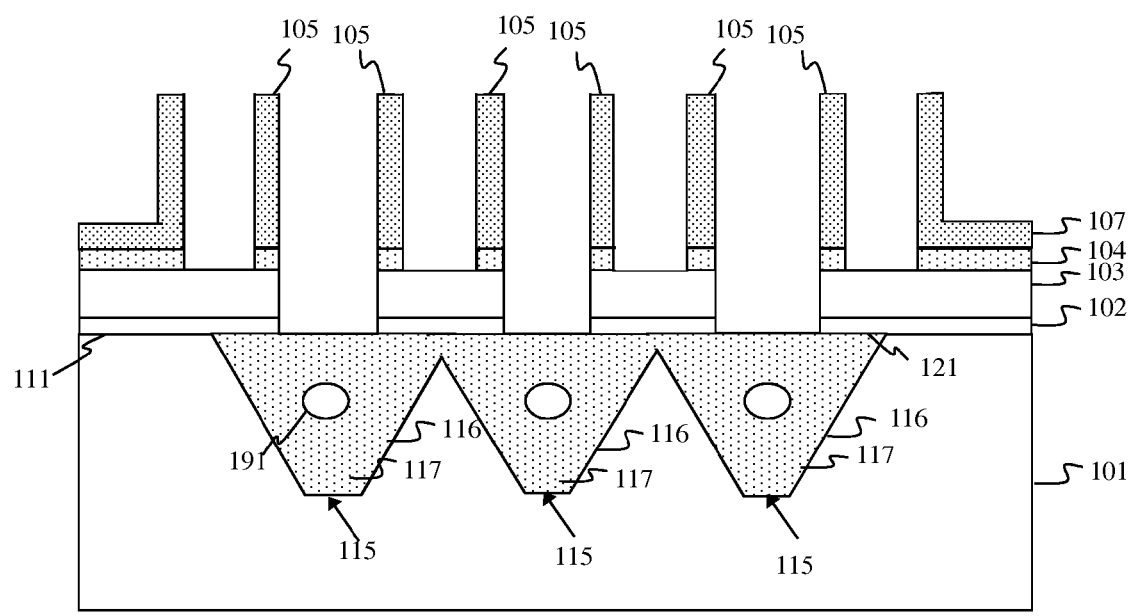
FIG. 13 is a cross-section diagram illustrating a partially completed semiconductor structure 100A formed according to the flow diagram of FIG. 2; and, FIG. 14 is a cross-section diagram illustrating a partially completed semiconductor structure 100A formed according to the flow diagram of FIG. 2.

The trench(es) 116 can be filled with one or more isolation layers 117, thereby forming corresponding trench isolation region(s) 115 (218, see FIG. 13). Specifically, one or more isolation layers 117 can be deposited so as to fill the trench(es) 116 and the opening 110 above the trench 116 (see FIG. 12). The isolation layer(s) 117 can comprise, for example, silicon dioxide or any other suitable isolation material. It should be noted that, as a function of the aspect ratio of the trench 116 and the processing technique used to fill the trench 116 with the isolation layer(s) 117, one or more air gaps 191 (i.e., air bubbles, voids, etc.) may be formed within the isolation layer(s) 117 in the trench 116, as shown in FIG. 12. It should further be noted that, if multiple trenches 116 are merged, the resulting trench isolation regions 115 will form an essentially continuous isolation region below the semiconductor layer 102. After the isolation layer(s) 117 are deposited, they can be etched back so as to be almost level with the top surface 111 of the semiconductor substrate 101, as shown in FIG. 13. That is, the isolation layer(s) 117 can be etched back such the top surface 121 of the isolation layer(s) 117 is essentially coplanar with the top surface 111 of the semiconductor substrate 101. It should be noted that this etch back process will also remove any exposed portions of the dielectric cap layer 104.

Figure 14:
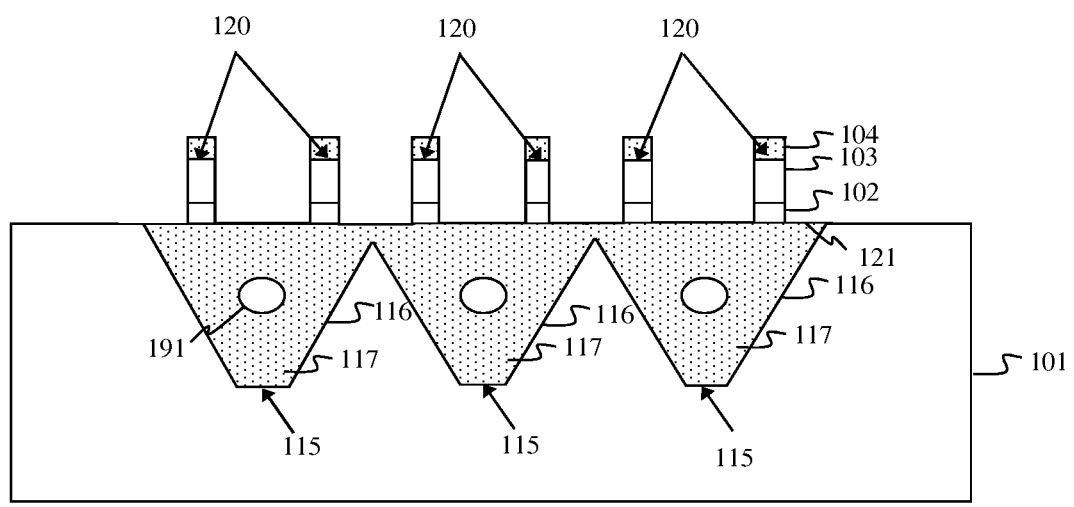

Next, a sidewall image transfer process can be performed using the sidewall spacers 105 to form a pair of semiconductor fins 120 above each trench isolation region 115 immediately adjacent to the isolation layer 117 (220, see FIG. 14). Specifically, a reactive ion etch (RIE) process can be performed using the sidewall spacers 105 and other remaining portions of the additional dielectric layer 107 as a mask, stopping at the top surface 121 of the isolation layer(s) in the trench isolation region(s) 115 below. Once the sidewall image transfer process is performed, the sidewall spacers 105 and other remaining portions of the additional dielectric layer 107 can be selectively removed. For example, if the additional dielectric layer 107 comprises a silicon nitride layer, it can be removed using, for example, a hot phosphoric acid etch process. Once the additional dielectric layer 107 is removed, the semiconductor fins 120 can be masked and edge portions of the stack of semiconductor layers 102-103 and the dielectric cap layer 104 not etched into semiconductor fins 120 can be removed.

Additional processing can then be performed to form one or more semiconductor devices 130 comprising one or more of the previously formed semiconductor fins 120 (222, see FIGS. 1A and 1B). For example, well-known MUGFET processing techniques can be used to form a MUGFET (e.g., a FINFET or a trigate FET) comprising one or more of the semiconductor fin(s) 120 and a gate structure 140 that traverses the semiconductor fin(s) 120. Alternatively, other well-known processing techniques can be used to form any other type of semiconductor device (e.g., a resistor, a diode, etc.) that incorporates one or more semiconductor fins.

It should further be noted that the terminology used herein is for the purpose of describing disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are semiconductor structures with monocrystalline semiconductor fins, which are above a trench isolation region in a bulk semiconductor substrate and which can be incorporated into one or more semiconductor devices. Also disclosed above are methods of forming such semiconductor structures. Specifically, to form the semiconductor structures, sidewall spacers can be formed on opposing sides of mandrels on a dielectric layer. Then, between adjacent mandrels, an opening can be formed that extends vertically through the dielectric layer, through multiple monocrystalline semiconductor layers and into a semiconductor substrate. Next, the portion of the opening in the substrate can be expanded to form a trench. This trench can undercut the semiconductor layers and, particularly, can extend laterally below adjacent sidewall spacers on either side of the opening. The trench can then be filled with an isolation layer, thereby forming a trench isolation region, and a sidewall image transfer process can be performed using the sidewall spacers to form a pair of monocrystalline semiconductor fins above the trench isolation region.

What is claimed is:

1. A semiconductor structure comprising:
    a semiconductor substrate having a first top surface;
    a trench isolation region in said semiconductor substrate, said trench isolation region comprising:
        a trench having a bottom surface and sidewalls; and,
        an isolation layer within said trench above and immediately adjacent to said bottom surface and positioned laterally between and immediately adjacent to said sidewalls, said isolation layer having a second top surface that is essentially coplanar with said first top surface of said semiconductor substrate; and,
    a pair of monocrystalline semiconductor fins on said trench isolation region immediately adjacent to said second top surface of said isolation layer.

2. The semiconductor structure of claim 1,
    said semiconductor substrate comprising a first semiconductor material,
    each semiconductor fin comprising a semiconductor layer immediately adjacent to said second top surface of said isolation layer and an additional semiconductor layer on said semiconductor layer,
    said semiconductor layer comprising a second semiconductor material that is different from said first semiconductor material, and
    said additional semiconductor layer comprising said first semiconductor material.

3. The semiconductor structure of claim 1, further comprising a dielectric cap layer on each semiconductor fin.

4. The semiconductor structure of claim 1, said pair of monocrystalline semiconductor fins being oriented in a <100> direction and said trench having at least one {110}-faceted sidewall.

5. The semiconductor structure of claim 1, said trench isolation region further comprising an air gap within said isolation layer in said trench.

6. The semiconductor structure of claim 1, further comprising a doped region in said semiconductor substrate immediately adjacent to said bottom surface of said trench and not positioned laterally adjacent to said sidewalls, said trench having a depth and a width, and said depth being less than said width.

7. The semiconductor structure of claim 1, further comprising an additional trench isolation region positioned laterally immediately adjacent to said trench isolation region and an additional pair of monocrystalline semiconductor fins above said additional trench isolation region.

8. The semiconductor structure of claim 1, said semiconductor structure further comprising at least one semiconductor device and said semiconductor device comprising at least one semiconductor fin of said pair.

9. The semiconductor structure of claim 1,
    said semiconductor substrate comprising a first semiconductor material, each semiconductor fin comprising a semiconductor layer immediately adjacent to said second top surface of said isolation layer and an additional semiconductor layer on said semiconductor layer, said semiconductor layer comprising a second semiconductor material that is different from said first semiconductor material, and said additional semiconductor layer comprising a third semiconductor material that is different from said first semiconductor material and said second semiconductor material.

10. A semiconductor structure comprising:
a semiconductor substrate having a first top surface;
a trench isolation region in said semiconductor substrate, said trench isolation region comprising:
   a trench having a bottom surface and sidewalls; and,
   an isolation layer within said trench above and immediately adjacent to said bottom surface and positioned laterally between and immediately adjacent to said sidewalls, said isolation layer having a second top surface that is essentially coplanar with said first top surface of said semiconductor substrate; and,
a pair of monocrystalline semiconductor fins on said trench isolation region immediately adjacent to said second top surface of said isolation layer, each semiconductor fin comprising multiple layers of different monocrystalline semiconductor materials.

11. The semiconductor structure of claim 10,
said semiconductor substrate comprising monocrystalline silicon,
each semiconductor fin comprising a semiconductor layer comprising any one of a monocrystalline silicon germanium layer, a carbon-doped monocrystalline silicon layer and a carbon-doped monocrystalline silicon germanium layer immediately adjacent to said second top surface of said isolation layer,
each semiconductor fin further comprising an additional semiconductor layer on said semiconductor layer, said additional semiconductor layer comprising a monocrystalline silicon layer.

12. The semiconductor structure of claim 10,
said semiconductor substrate comprising monocrystalline silicon,
each semiconductor fin comprising a semiconductor layer comprising a monocrystalline silicon germanium layer immediately adjacent to said second top surface of said isolation layer,
each semiconductor fin further comprising an additional semiconductor layer on said semiconductor layer, said additional semiconductor layer comprising a carbon-doped monocrystalline silicon layer.

13. The semiconductor structure of claim 10, said pair of monocrystalline semiconductor fins being oriented in a <100> direction and said trench having at least one {110}-faceted sidewall.

14. The semiconductor structure of claim 10, said trench isolation region further comprising an air gap within said isolation layer in said trench.

15. The semiconductor structure of claim 10, further comprising a doped region in said semiconductor substrate immediately adjacent to said bottom surface of said trench and not positioned laterally adjacent to said sidewalls, said trench having a depth and a width, and said depth being less than said width.

16. The semiconductor structure of claim 10, further comprising an additional trench isolation region at said top surface positioned laterally immediately adjacent to said trench isolation region and an additional pair of monocrystalline semiconductor fins above said additional trench isolation region.

17. The semiconductor structure of claim 10, said semiconductor structure further comprising at least one semiconductor device and said semiconductor device comprising at least one semiconductor fin of said pair.

18. A semiconductor structure comprising:
a semiconductor substrate having a first top surface;
a trench isolation region in said semiconductor substrate, said trench isolation region comprising:
   a trench having a bottom surface and said trench having {110}-faceted sidewalls; and,
   an isolation layer within said trench above and immediately adjacent to said bottom surface and positioned laterally between and immediately adjacent to said sidewalls, said isolation layer having a second top surface that is essentially coplanar with said first top surface of said semiconductor substrate; and,
a pair of semiconductor fins on said trench isolation region immediately adjacent to said second top surface of said isolation layer, each semiconductor fin comprising multiple layers of different monocrystalline semiconductor materials.

19. The semiconductor structure of claim 18,
said semiconductor substrate comprising monocrystalline silicon,
each semiconductor fin comprising a semiconductor layer comprising any one of a monocrystalline silicon germanium layer, a carbon-doped monocrystalline silicon layer and a carbon-doped monocrystalline silicon germanium layer immediately adjacent to said second top surface of said isolation layer,
each semiconductor fin further comprising an additional semiconductor layer on said semiconductor layer, said additional semiconductor layer comprising a monocrystalline silicon layer.

20. The semiconductor structure of claim 18,
said semiconductor substrate comprising monocrystalline silicon,
each semiconductor fin comprising a semiconductor layer comprising a monocrystalline silicon germanium layer immediately adjacent to said second top surface of said isolation layer,
each semiconductor fin further comprising an additional semiconductor layer on said semiconductor layer, said additional semiconductor layer comprising a carbon-doped monocrystalline silicon layer.

* * * * *